United States Patent [19]
Draper

[11] Patent Number: 5,925,913
[45] Date of Patent: Jul. 20, 1999

[54] SYSTEM FOR ENHANCING THE PERFORMANCE OF A CIRCUIT BY REDUCING THE CHANNEL LENGTH OF ONE OR MORE TRANSISTORS

[75] Inventor: Donald A. Draper, San Jose, Calif.

[73] Assignee: Advanced Micro Devices, Inc., Sunnyvale, Calif.

[21] Appl. No.: 08/918,062

[22] Filed: Aug. 25, 1997

[51] Int. Cl.⁶ .......................... H01L 29/76; H01L 29/94; H01L 31/062; H01L 31/113
[52] U.S. Cl. .......................................................... 257/344
[58] Field of Search ............................................. 257/344

[56] References Cited

U.S. PATENT DOCUMENTS

| | | | |
|---|---|---|---|
| 4,740,713 | 4/1988 | Sakurai et al. | 307/200 |
| 4,753,898 | 6/1988 | Parrillo et al. | 437/44 |
| 4,857,763 | 8/1989 | Salurai et al. | 307/443 |
| 4,994,404 | 2/1991 | Sheng et al. | 437/44 |
| 5,012,306 | 4/1991 | Tasch, Jr. et al. | 357/23.4 |
| 5,036,019 | 7/1991 | Yamane et al. | 437/57 |
| 5,043,788 | 8/1991 | Omoto et al. | 357/42 |
| 5,063,304 | 11/1991 | Iyengar | 307/296.6 |
| 5,455,528 | 10/1995 | Partovi et al. | 326/98 |
| 5,487,025 | 1/1996 | Partovi et al. | 364/788 |
| 5,508,640 | 4/1996 | Partovi et al. | 326/98 |

*Primary Examiner*—Stephen D. Meier
*Attorney, Agent, or Firm*—Fliesler, Dubb, Meyer & Lovejoy LLP

[57] ABSTRACT

Generally, decreasing the length of the channel in a CMOS transistor increases the speed of the transistor. However, the degree that the channel can be minimized is limited due to Hot Carrier Injection ("HCI"), which is related to the drain to source voltage and channel length. The present invention increases the speed of a circuit by decreasing the channel length of subset of transistors in the circuit. The subset is chosen by identifying instances where more than one transistor in series is used to discharge a capacitance. Those transistors are subject to lower drain to source voltages; therefore, the channel length can be reduced without suffering from the effects of HCI.

23 Claims, 4 Drawing Sheets

SYSTEM FOR ENHANCING THE PERFORMANCE OF A CIRCUIT BY REDUCING THE CHANNEL LENGTH OF ONE OR MORE TRANSISTORS

BACKGROUND OF THE INVENTION

1. Field of the Invention

The present invention relates to a system enhancing the performance of a circuit by reducing the channel length of one or more transistors in the circuit.

2. Description of the Related Art

Figure 1:
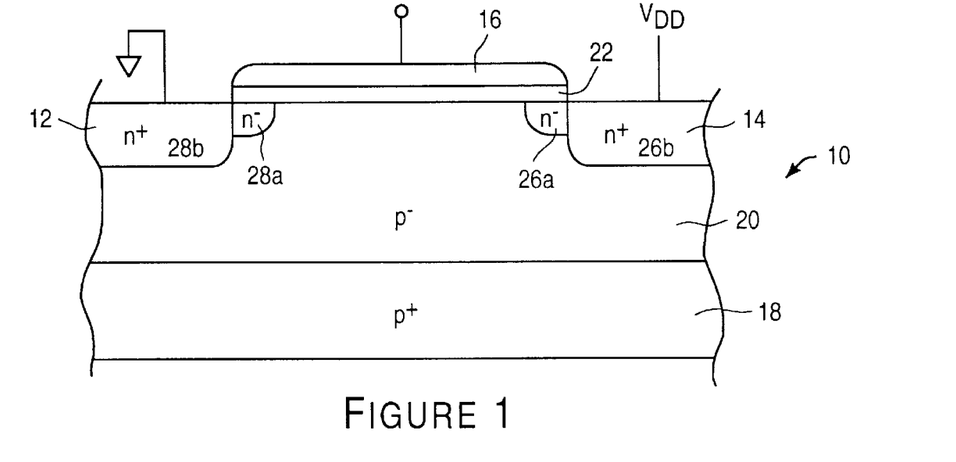
FIG. 1 illustrates a cross section of a CMOS transistor.

There has been a constant effort to increase the speed of integrated circuits by increasing the switching speed of the transistors in the integrated circuits. One means for increasing the speed of a transistor is to shorten the channel length of the transistor. FIG. 1 illustrates the cross section of a CMOS transistor 10 having a source 12, drain 14 and gate 16. In one configuration, the substrate includes a highly doped p region 18 and a lightly doped p region 20. Between gate 16 and lightly doped P region 20 is a gate dielectric or oxide 22. The area below gate 16 and between source 12 and drain 14 is called the channel.

MOS transistors with small channel lengths are prone to hot carrier injection (HCI). HCI occurs as a result of a large electric field developed in substrate 20 near the drain 14 when the transistor is operated in a saturated condition. The large electric field at the edge of drain 14 provides sufficient potential to force carriers into gate dielectric 22. The injected carriers increase the amount of trapped charge in gate dielectric 22 and change the charge distribution causing a shift in the threshold voltage. Over a period of time the amount of trapped charge in gate dielectric 22 increases as the transistors are repeatedly brought to a condition of saturation. Eventually, the threshold is shifted to a point where the circuit slows down.

One solution to the problem of hot carrier injection is to form a lightly doped drain (LDD) structure. The LDD structure consists of a lightly doped drain region 26a adjacent to the gate with a heavily doped drain region 26b laterally displaced from the gate electrode. The LDD structure also includes a lightly doped source region 28a adjacent to the gate with a heavily doped source region 26b laterally displaced from the gate. The lightly doped region is diffused under the gate dielectric and produces a small electric field near the edge of the drain, thus reducing carrier injection into the dielectric. The heavily doped source/drain regions provide a low resistance region where an ohmic contact can be made.

In some cases, it is desirable to augment the protection against device degradation that the LDD structure provides. For example, to increase the speed of the circuit it may be desired to utilize a transistor having a channel length smaller than otherwise acceptable even with the LDD structure. In such a case, LDD does not provide proper protection from HCI.

In other cases, it is desirable to avoid the increased processing complexity that the LDD structure requires, while still providing for device protection against excessive operating fields and HCI.

Therefore, a system is needed to reduce the channel length of at least some of the transistors in a circuit in order to increase the speed of the circuit without suffering from the effects of HCI.

SUMMARY OF THE INVENTION

The present invention, roughly described, provides for a system that can increase the speed of a circuit by reducing the channel length of one or more transistors in a circuit without suffering from the effects of HCI. The present invention is accomplished by identifying transistors in the circuit that are stacked and providing the identified stacked transistors with channel lengths that are shorter than other transistors in the circuit. While shortening transistors typically increases the risk of HCI, stacked transistors are less susceptible to HCI because they experience lower drain to source voltages. The steps of the present invention can be performed by an engineer or by a computer running software residing an a processor readable storage medium.

An integrated circuit made in accord with the present invention includes a first group of transistors and a second group of transistors. The first group of transistors are made with a first channel length. The second group of transistors are made with a second channel length. The second channel length is smaller than the first channel length. Each transistor of the second group of transistors is in a low drain to source voltage environment as compared to at least a subset of the first group of transistors.

These and other objects and advantages of the invention will appear more clearly from the following detailed description in which the preferred embodiment of the invention has been set forth in conjunction with the drawings.

DETAILED DESCRIPTION

Generally, most of the transistors on an integrated circuit have the same channel length. That channel length is minimized to increase speed, but it cannot be made too small due to the effects of HCI. Circuit designers typically will look to a representative worst case scenario in the circuit to determine how small the channel length can be made without suffering from HCI. For example, a circuit designer may consider an inverter in the circuit as a worst case for HCI. Usually, an inverter includes a p-transistor and an n-transistor. The source of the p-transistor is connected to the drain of the n-transistor forming the output of the inverter and the two gates are connected together to form the input of the inverter. In response to an input signal, one of the transistors will turn on and the other transistor will remain turned off. Therefore, one of the transistors in the inverter will be subject to the entire voltage drop $V_{DD}$. Since one transistor will be subject to the entire voltage drop, the effects of HCI are at a relative maximum. A circuit designer will determine the smallest channel length for the transistors in the inverter such that the effect of HCI does not degrade the circuit. That channel length will be used for most of the transistors in the circuit.

Using the present invention, the channel length of certain transistors can be made smaller without suffering from HCI.

That is, the present invention includes a means for identifying a subset of transistors in the circuit that can be made with a reduced channel length without suffering from HCI.

Figures 2, 3A:
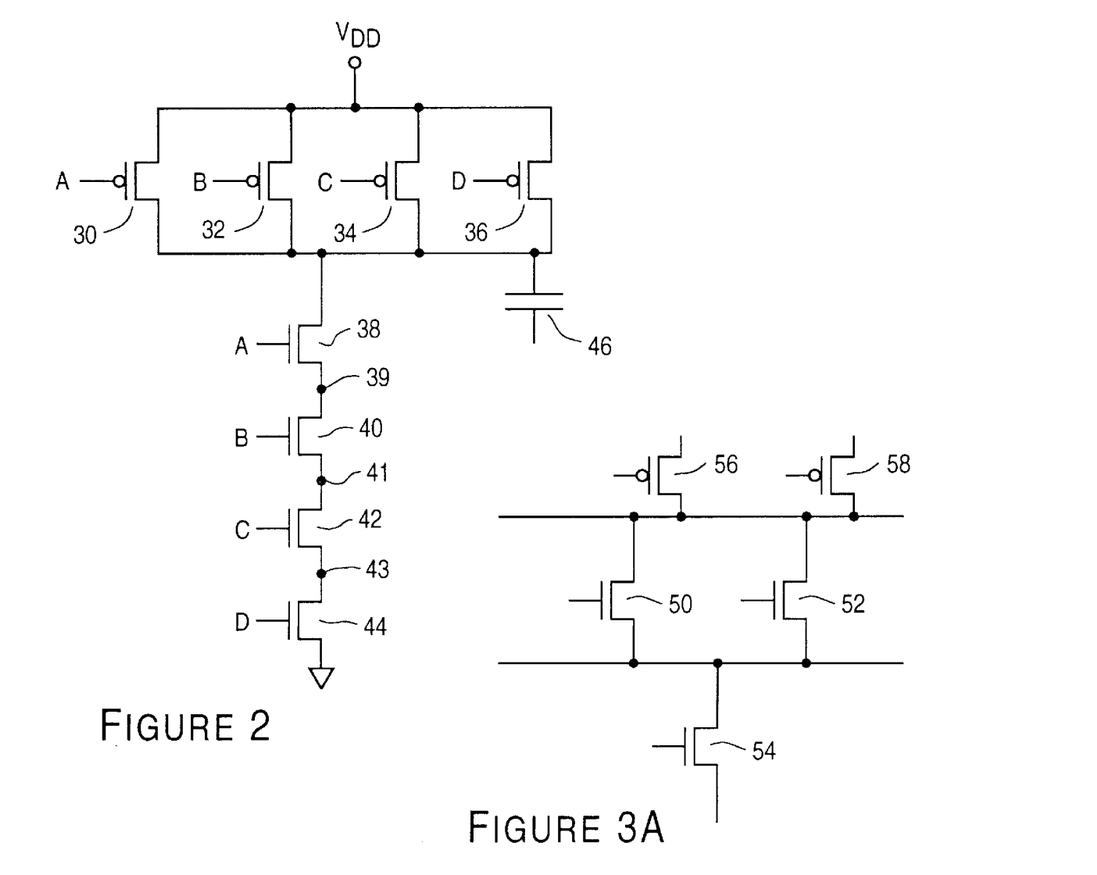
FIG. 2 is schematic of a NAND gate.
FIG. 3A is a schematic for part of a circuit having stacked transistors.

FIG. 2 is a schematic of a NAND gate having four inputs A, B, C and D. The NAND gate includes four p-transistors 30, 32, 34 and 36 connected in parallel. That is, the sources of all four transistors are connected together and the drains of all four transistors are connected together. The gate of transistor 30 is connected to input A, the gate of transistor 32 is connected to input B, the gate of transistor 34 is connected to input C and the gate of transistor 36 is connected to input D. The NAND gate also includes four n-transistors 38, 40, 42 and 44 connected in series. The drain of transistor 38 is connected to the drains of transistors 30, 32, 34 and 36. The gate of transistor 38 is connected to input A, and the source of transistor 38 is connected to the drain of transistor 40. The gate of transistor 40 is connected to input B, and the source of transistor 40 is connected to the drain of transistor 42. The gate of transistor 42 is connected to input C, and the source of transistor 42 is connected to the drain of transistor 44. The gate of transistor 44 is connected to input D, and the source of transistor 44 is connected to $V_{SS}$. FIG. 2 also shows capacitor 46 connected to the drains of transistors 30, 32, 34 and 36. Capacitor 46 represents the load on the NAND gate of FIG. 2.

When all four inputs A, B, C and D are at logic 1, transistors 38, 40, 42 and 44 all will be turned on and transistor 30, 32, 34 and 36 are off. Thus, transistor 38, 40, 42 and 44, in series, will be subject to the entire voltage drop across the NAND gate. The voltage seen at the drain of transistor 38 will be $V_{DD}$. Since transistor 38 will not turn on until the gate to source voltage is at least equal to the threshold voltage $V_{TN}$ for transistor 38, the voltage at node 39 of FIG. 2 will be approximately equal to $V_{DD}-V_{TN}$. Similarly, the voltage at nodes 41 and 43, when transistors 38, 40, 42 and 44 are all turned on, is also approximately equal to $V_{DD}-V_{TN}$. Thus, transistors 40, 42 and 44 are not being subject to the full voltage $V_{DD}$.

HCI is exacerbated by high $V_{DS}$ (drain to source voltage) and by short channel lengths. Therefore, by reducing $V_{DS}$ the channel length can also be reduced without causing HCI. As discussed above, transistors of a circuit are designed to minimize the channel length for a predetermined $V_{DD}$. If a particular transistor can be guaranteed to be subject to a voltage no greater than some value less than $V_{DD}$, then the channel length can be reduced for that transistor in proportion to the maximum voltage that that transistor will see. In the discussion of FIG. 2, transistors 40, 42 and 44 will never be subject to $V_{DD}$. Rather, they will be subject to, at most, $V_{DD}-V_{TN}$. Therefore, the channel lengths of transistors 40, 42 and 44 can be reduced in light of the lower source to drain to voltage.

Transistors 40, 42 and 44 are said to be in a lower source drain voltage environment. The maximum $V_{DS}$ for transistors 40, 42 and 44 is lower than other transistors on the circuit (e.g. the transistors in an inverter). One means for testing for this condition is to identify subcircuits where two or more transistors, effectively in series, are used to discharge a capacitance. Such transistors are said to be stacked or in a stack. For example, the circuit of FIG. 2, four transistors 38, 40, 42 and 44, in series, are being used to discharge the capacitance represented by capacitor 46. Thus, transistors 38, 40, 42 and 44 are said to be stacked.

The above analysis discusses why the lower transistors of a stack can use a shorter channel length. The term "lower transistors of a stack" is defined to include all of the transistors in a stack except for the top transistor. The top transistor is the transistor closest to the load capacitance. For example, in the NAND gate of FIG. 2, the stack includes transistors 38, 40, 42 and 44. Transistor 38 is the top transistor and transistors 40, 42 and 44 are the lower transistors. Typically, the channel lengths of the lower transistors will be equal. Since, the semiconductor fabrication process is not perfect, the term "equal" is used to mean approximately equal with minor deviations due to the fabrication process.

In addition to shortening the channel length for transistors 40, 42 and 44 because of the lower $V_{DS}$, the channel length for transistor 38, the top transistor, can also be shortened because of an IR effect. That is, when all four transistors 38, 40, 42 and 44 are turned on, there is an IR drop across transistors 40, 42 and 44. Therefore, the voltage drop $V_{DS}$ across transistor 38 is reduced and the channel length of transistor 38 can also be reduced accordingly. In one embodiment, the channel length of the top transistor is reduced to a length which is longer than the channel length of the lower transistors on a given stack. In another embodiment, the top transistor and the lower transistor(s) are reduced to the same channel length.

Assuming that the channel length of the standard transistor in a particular integrated circuit is 0.25 μm, the inventor contemplates shortening the channel length of the top transistor to 0.225 μm and shortening the channel length of the lower transistors to 0.20 μm. These channel lengths will dramatically increase the speed of the transistors. Another alternative which is more conservative includes reducing the channel length of the top and bottom transistors by 0.02 μm.

Table 1, below, provides data that demonstrates the increase in speed obtained from shortening the channel length of one or more transistors as described above. Tests were performed on a five stage ring oscillator, with each stage being identical. The left hand column of Table 1 explains the topography of the stages and how the test was performed. The four right hand columns of Table 1 lists the delay times per stage in pico seconds for four different channel lengths.

For example, the first row represents a test using a ring oscillator where each stage is a four input NAND gate as shown in FIG. 2. The three lowered transistors 40, 42 and 44 are shortened and top transistor 38 is not shortened in any of the tests. Inputs A, B and C are held high and input D is switched off and on; therefore, only transistor 44 is switched. The first column of data is for a test in which all four transistors 38, 40, 42 and 44 have a channel length equal to 0.25 μm. The delay for each stage is 109 ps. The second column of data is for a test in which the channel length of transistor 38 remains at 0.25 μm and the channel length of transistors 40, 42 and 44 are reduced to 0.22 μm. Note that the stage delay drops to 90.7 ps. The third column of data is for a test in which the channel length of transistor 38 remains at 0.25 μm and the channel length of transistors 40, 42 and 44 are reduced to 0.21 μm. Note that the stage delay drops to 83.4 ps. The fourth column of data is for a test in which the channel length of transistor 38 remains at 0.25 μm and the channel length of transistors 40, 42 and 44 are reduced to 0.20 μm, causing the stage delay to be reduced to 75.4 ps.

The second row of Table 1 represents a test on the same NAND gate as the first row except inputs B, C and D are all held high and input A is switched between 0 and 1, causing transistor 38 to be switched. As can be seen, reducing the channel length of transistors 40, 42 and 44 from 0.25 μm to 0.20 μm reduces the delay from 63.9 ps to 58.2 ps. The third row of Table 1 correlates to a test on the same NAND gate as in the first two rows; however, input B (and transistor 40) is switched while inputs A, C and D are held high. Similarly, the fourth row of Table 1 represents a test on the same NAND gate as in the first three rows; however, nodes A, B and D are held high while node C (and transistor 42) is switched.

The fifth and sixth rows of Table 1 correspond to using a two input NAND gate at each stage, the top transistor in the stack does not have its channel lengths reduced and the lower transistor in the stack will have its channel length reduced as labeled for each column. The seventh and eighth rows of Table 1 correspond to a test on a four input NAND gate with all four transistors on the stack (e.g. transistors 38, 40, 42 and 44) having their channel lengths reduced by the amount as labeled in the column titles.

TABLE 1

| Circuit/Test Description | Stage delays for different channel lengths | | | |
|---|---|---|---|---|
| | 0.25 $\mu$m | 0.22 $\mu$m | 0.21 $\mu$m | 0.20 $\mu$m |
| 4 input NAND gate, 3 lower transistors shortened, switch transistor 44 | 109 | 90.7 | 83.4 | 75.4 |
| 4 input NAND gate, 3 lower transistors shortened, switch transistor 38 | 63.9 | 60.6 | 59.4 | 58.2 |
| 4 input NAND gate, 3 lower transistors shortened, switch transistor 40 | 83.4 | 70.4 | 65.3 | 59.8 |
| 4 input NAND gate, 3 lower transistors shortened, switch transistor 42 | 98.2 | 82.2 | 75.8 | 68.8 |
| 2 input NAND gate, bottom transistor shortened, switch top transistor | 45.1 | 43.9 | 43.5 | 43.1 |
| 2 input NAND gate, bottom transistor shortened, switch lower transistor | 59.6 | 51.3 | 47.7 | 43.6 |
| 4 input NAND gate, all four transistors shortened, switch lower transistor | 109 | 90.3 | 83.0 | 75.1 |
| 4 input NAND gate, all four transistors shortened, switch top transistor | 63.9 | 52.3 | 47.9 | 43.5 |
| 2 input NOR gate, both transistors shortened, switch top transistor | 42.9 | 40.2 | 39.3 | 38.4 |
| 2 input NOR gate, both transistors shortened, switch lower transistor | 53.5 | 44.8 | 41.7 | 38.6 |

Some stacked p-transistors may also be able to utilize the present invention because stacked p-transistors are less sensitive to leakage current than nonstacked p-transistors due to the smaller voltage drop. When applying the present invention to a stack of p-transistors, the channel lengths of the p-transistors on the stack are reduced except for the p-transistor on the stack that is closest to the output node. The speed increase for shortening the channel length of a p-transistor is not as dramatic as that for n-transistor. For example, a NOR gate is typically designed with a number of n-transistors in parallel connected to a stack of p-transistors. The speed of the NOR gate can be increased by reducing the channel length of the p-transistors except for the p-transistor that is connected to the n-transistors. The bottom two rows of Table 1 show data for a test performed on a two input NOR gate where lower p-transistor of the stack has reduced channel lengths as labeled by the columns. As a conservative recommendation, if the channel length of the standard transistor is 0.25 $\mu$m, then the channel length of a p-transistor in the stack can be reduced by 0.01 $\mu$m.

Circuits or subcircuits other than a NAND gate and NOR gate can also take advantage of the present invention, such as multiplexers in series, sense amplifiers, differential amplifiers, etc. For example, FIG. 3A shows a portion of a AND-OR-Inverter circuit. The portion of the circuit depicted includes transistors 50, 52, 54, 56 and 58. N-transistor 50 and n-transistor 52 are in parallel. The sources of transistor 50 and 52 are connected to the drain of transistor 54. The drains of transistors 50 and 52 are connected to the drains of p-transistors 56 and 58. Transistors 50, 52 and 54 are in a low source to drain voltage environment and are considered stacked because transistors 50 and 52 are effectively in series with transistor 54. That is, the circuit is designed such that either transistor 50 or 52 are turned on but never both at the same time. Thus, the transistor that is turned on is effectively in series with and forms a stack with transistor 54 such that both transistors will be used to discharge a load capacitance. The voltage drop across transistor 54 will be less than $V_{DD}$ and its channel length can be reduced accordingly. Similarly, the IR drop across transistor 54 will cause the voltage to be reduced for the transistor turned on (e.g. either transistor 50 or transistor 52); therefore, the channel length of transistors 50 and 52 can be reduced.

Figure 3B:
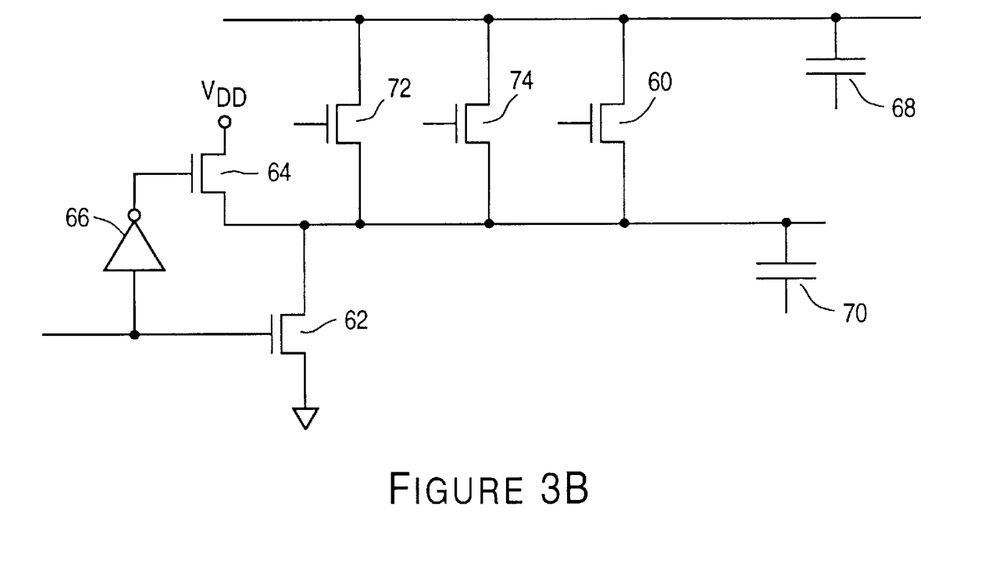
FIG. 3B is a schematic for part of a circuit having stacked transistors.

FIG. 3B show portions of a custom circuit design including an inverter 66 having its input connected to the gate of n-transistor 62 and its output connected to the gate of n-transistor 64. The drain of n-transistor 64 is connected to $V_{DD}$. The source of n-transistor 64 is connected to the drain of n-transistor 62 and the sources of n-transistors 72, 74 and 60. The source of n-transistor 62 is connected to $V_{SS}$. The drains of transistors 72, 74 and 60 are connected together. Capacitor 68, shown connected to the drains of transistor 60, 72 and 74, represents the load capacitance being discharged. Capacitor 70, shown connected to the sources of transistors 60, 64, 72 and 74, represents a parasitic capacitance (e.g. from a long wire). In the circuit of FIG. 3B, more than one transistor effectively in series will be used to discharge load capacitor 68. That is, either transistor 72, 74 or 60 will be turned on, and thus, become effectively in series with transistor 62 in order to discharge capacitor 68. Thus, the channel length transistor 62 can be reduced. The channel lengths of transistors 60, 72 and 74 can also be reduced due to the IR drop across transistor 62.

One limitation on the present invention is that if the capacitance at an intermediate node of a stack is too large, the transistors discharging that capacitance will experience HCI. For example, in the circuit of FIG. 3B, if capacitance 70 is too large, than one or more transistors on the stack may experience HCI. One means for determining whether the capacitance is too great is to use judgment based on the experiences of the circuit designer. An easier test to implement would include observing the rise time of the load capacitance. For example, if the rise time is greater than 300 ps, then the circuit may experience charge sharing and HCI and, thus, the channel lengths of the stacked transistors should not be reduced. A similar inquiry concerning the load capacitance should also be made with respect to the NAND gate of FIG. 2 and any other circuit for which the present invention is applied to.

Figure 3C:
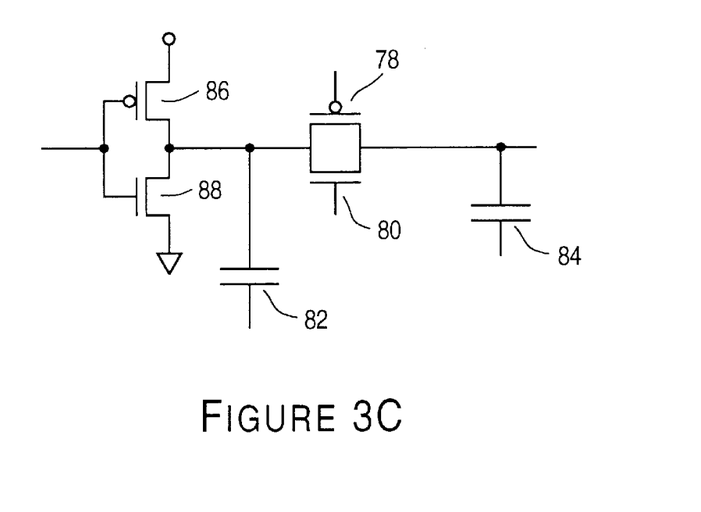
FIG. 3C is a schematic for part of a circuit having stacked transistors.

FIG. 3C shows an inverter connected to a transfer gate. The inverter includes p-transistor 86 and n-transistor 88. The gates of p-transistor 86 and n-transistor 88 are connected together forming the input of the inverter. The drain of transistor 86 is connected to the drain of transistor 88, the source of p-transistor 78 and the drain of n-transistor 80. Transistors 78 and 80 comprise the transfer gate. The drain of transistor 78 and the source of transistor 80 are connected together forming the output of the transfer gate. Capacitor 82 is shown connected to the node between the inverter and the transfer gate. Capacitor 84 represents the load capacitance at the output of the transfer gate. In the circuit of FIG. 3C, transistors 88 and 80 are in a low source of drain voltage environment and, thus, are considered to be stacked. Although transistor 78 pulls up to $V_{DD}$, if capacitor 84 is being discharged, it will be discharged across transistors 80 and 88 which are effectively in series when discharging capacitor 84. Thus, the channel length of transistor 88 can be reduced without suffering from HCI. Due to the IR drop across transistor 88, the channel length of transistor 80 can also be reduced. Note that for the reduction of channel lengths to be effective without incurring the effects of HCI, capacitance 82 cannot be too large.

Figure 4:
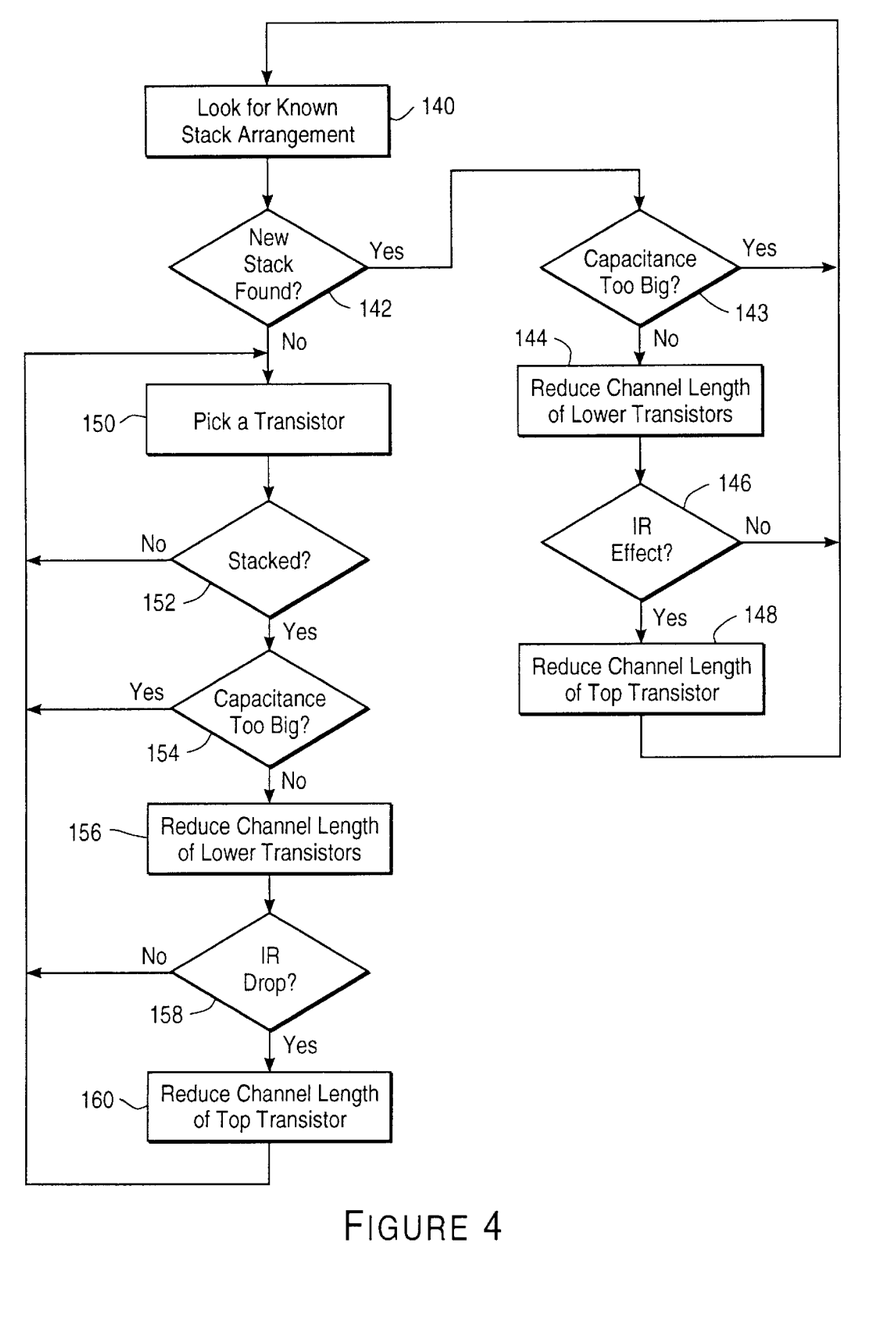
FIG. 4 is a flow chart of the steps for enhancing the performance of a circuit by reducing the channel length of stacked transistors.

FIG. 4 is a flow chart of one exemplar method for utilizing the present invention. The steps of FIG. 4 can be performed by an engineer using a circuit diagram, layout, net list, etc., including any electronic representation of the circuit. Alternatively, the method can be performed by a computer.

The first step includes looking for a known stack arrangement (step 140). It is contemplated that software, or an engineer, would have a set of known subcircuits that can utilize the present invention. An example of a known subcircuit would be a NAND gate of FIG. 2, a NOR gate, or other subcircuits that appear throughout a circuit and are known to be able to utilize the present invention. If one of these known stack arrangements are found (step 142), then an inquiry is made as to whether the transistors of the particular stack are subject to an intermediate capacitance that is too large (step 143). As discussed above, one method for determining whether the capacitance is too big is to look at the rise time of the load capacitance. If the load capacitance is too large, then the transistors of the stack cannot have their channel lengths reduced and the method loops back to step 140 to consider another stack. If the capacitance is not too large then the system will reduce the channel lengths of the lower transistors (step 144) for one stack. For example, in the circuit of FIG. 2, step 144 would include reducing the channel length of transistors 40, 42 and 44.

The step of reducing the channel length of a transistor does not actually change a physically existing transistor. Rather, the transistor under consideration is provided with a smaller channel length than other transistors when the transistor is fabricated. The sizing of the channel length is performed during the photolithography phase of the fabrication process. Photolithography is a process used to create the patterns on the wafer. The required pattern is first formed on a reticle or photomask and transferred to the surface layer(s) of the wafer through the photomasking steps. The steps generally include cleaning the wafer surface, applying a coat of photoresist to the surface of the wafer, partially evaporating some of the photoresist solvents by heating, aligning the mask/reticle to the wafer, exposing the photoresist, removing unpolymerized resist, evaporating solvents, etching, and removing the photoresist. The channel length can be made smaller when fabricating a transistor using the above described process by reducing the size of the image of the poly gate on the mask. If the method of FIG. 4 is performed separately from the fabrication process, then an engineer or a computer program can indicate in a circuit diagram, layout, net list, recipe, electronic representation of the circuit, the circuit description, etc., that the particular transistor is to be provided with a shorter channel length.

After step 144, a determination is made as to whether the top transistor in the stack is in a low source to drain voltage environment because of an IR drop across the lower transistors (step 146). If not, the system loops back to step 140 and looks for another known stack arrangement. If the top transistor is in a low source to drain voltage environment, then the channel length of the top transistor is reduced (step 148). After step 148, the system loops back to step 140 and looks for another known stack arrangement.

Depending on the stage of development and the circuit diagram or electronic representation of the circuit being used, steps 140–148 can be performed for each instance of a subcircuit or can be performed once for the subcircuit. For example, if the circuit is a gate array which is designed using a number of predefined macro cells and one of those macro cells is a NAND gate, then steps 140–148 can be used to change the definition of the macro cell for the NAND gate. Alternatively, steps 140 through 148 can be performed repeatedly for each appropriate instance of a NAND gate in the circuit.

After each known stack arrangement has been processed and no new stack arrangements are found (step 142), the system will pick a transistor in the circuit (step 150). Step 150 can randomly pick a transistor in a circuit. Alternatively, if the process is being performed by a circuit designer, that circuit designer may have knowledge of the circuit that enables the designer to start with those transistors that are most likely to be in a stack. Step 150 should not pick a transistor which has already had its channel length reduced in either steps 144 or 148.

After picking a transistor in step 150, a determination is made whether that transistor is in a stack. If it is not, the method loops back to step 150 and another transistor should be picked. If that transistor is in a stack (step 152), then an inquiry should be made whether the transistor is subject to an intermediate capacitance that is too large (step 154). That is, whether the load capacitance is too big to enable channel lengths to be reduced. If the capacitance is too large, then the method loops back to step 150 and another transistor is picked. If the capacitance is not too large, then the channel length for the lower transistors in the stack are reduced (step 156).

After reducing the channel length of the lower transistors, an inquiry is made as to whether the lower transistor(s) has a sufficient IR drop to decrease the voltage drop across the top transistor (step 158). If not, the method loops back to step 150 and another transistor is picked. If the top transistor is in a low source of drain voltage environment, then the channel length of that top transistor is reduced (step 160). After reducing the channel length of the top transistor, the method loops back to step 150 and another transistor is picked. In step 150, a new transistor should be picked that has not already been processed in steps 150–160. When there are no more transistors to pick in step 150, then the method is done. The present invention can be used to enhance the performance of many different electrical devices, including microprocessors.

Figure 5:
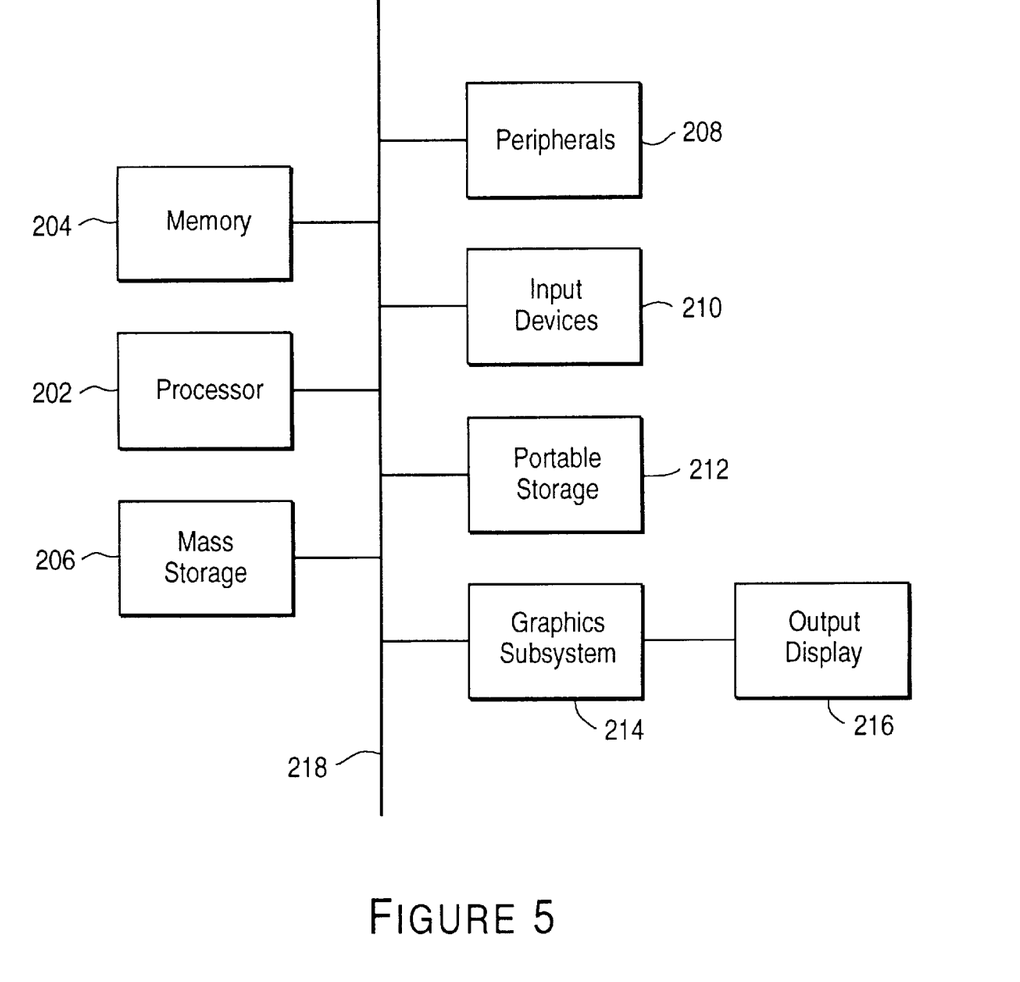
FIG. 5 is a block diagram of exemplar hardware for performing the steps depicted in FIG. 4.

As discussed above, the method of FIG. 4 can be implemented using software running on a computer. FIG. 5 illustrates a high level block diagram of an exemplar general purpose computer system which can be programmed to read an electronic representation of a circuit and perform the steps of FIG. 4. The computer system includes a processor unit 202 and main memory 204. Processor unit 202 may include a single microprocessor, or may contain a plurality of microprocessors. Main memory 204 stores, in part, instructions and data for execution by processor unit 202.

The computer system also includes mass storage device 206, peripheral device(s) 208, input device(s) 210, portable storage medium drive(s) 212, graphics subsystem 214 and output display 216. For purposes of simplicity, the components in the computer system are shown as being connected via a single bus 218. However, the computer system may be connected through one or more data transport means. For example, processor unit 202 and main memory 204 may be connected via a local microprocessor bus. Mass storage device 206, peripheral device(s) 208, portable storage medium drive(s) 212 and graphics subsystem 214 may be connected via one or more input/output (I/0) busses. Mass storage device 206, which may be implemented with a magnetic disk drive or an optical disk drive, is a non-volatile storage device for storing data and instructions for use by processor unit 202. In one embodiment, mass storage device 206 stores the program or the electronic representation of the circuit for purposes of loading to main memory 204.

Portable storage medium drive 212 operates in conjunction with a portable non-volatile storage medium, such as a floppy disk, to input and output data and code to and from the computer system. In one embodiment, the program or electronic representation of the circuit are stored on such a portable medium, and are input to the computer system via the portable storage medium drive 212. Peripheral device(s) 208 may include any type of computer support device, such as an input/output (I/O) interface, to add additional functionality to the computer system. For example, peripheral device(s) 208 may include a network interface card for interfacing the computer system to a network, a modem, etc.

Input device(s) 210 provide a portion of the user interface and may include an alpha-numeric keypad for inputting alpha-numeric and other key information, or a cursor control device, such as a mouse, a trackball, glidepad or cursor direction keys. In order to display textual and graphical information, the computer system contains graphics subsystem 214 and the output display 216. Output display 216 may include a cathode ray tube (CRT) display, liquid crystal display (LCD) or other suitable display device. Graphics subsystem 214 receives textual and graphical information, and processes the information for output to output display 216. The components depicted in FIG. 5 are those typically found in general purpose computer systems, and are intended to represent a broad category of such computer components that are well known in the art. Numerous other systems can also suffice such as systems with different bus configurations, networked systems, multi-processor systems, other personal computers, workstations, mainframes, and so on.

The foregoing detailed description of the invention has been presented for purposes of illustration and description. It is not intended to be exhaustive or to limit the invention to the precise form disclosed, and obviously many modifications and variations are possible in light of the above teaching. The described embodiment was chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A processor readable storage medium having processor readable program code embodied on said processor readable storage medium, said processor readable program code for programming a processor to perform a method for enhancing the performance of a semiconductor integrated circuit, the method comprising the steps of:

identifying a first set of stacked transistors in said integrated circuit; and indicating that said first set of stacked transistors are to be provided with channel lengths shorter than a second set of transistors in said integrated circuit.

2. A processor readable storage medium according to claim 1, wherein:

said step of identifying includes the steps of identifying one or more stacks of transistors and determining whether said stacks are subject to a large capacitance.

3. A processor readable storage medium according to claim 2, wherein:

said first set of stacked transistors does not include transistors in stacks that are subject to a large capacitance.

4. A processor readable storage medium according to claim 1, wherein:

said step of identifying includes determining whether a particular transistor is stacked.

5. A processor readable storage medium according to claim 1, wherein:

said step of identifying includes identifying one or more stacks of transistors, each stack includes one top transistor and one or more lower transistors; and said first set of stacked transistors includes lower transistors and top transistors.

6. A processor readable storage medium according to claim 1, wherein:

said step of identifying includes identifying one or more stacks of transistors, each stack includes one top transistor and one or more lower transistors; and said first set of stacked transistors includes lower transistors and does not include top transistors.

7. A semiconductor integrated circuit, comprising:

a first plurality of transistors, each transistor of said first plurality of transistors having a first channel length; and a second plurality of transistors having channel lengths smaller than said first channel length, each transistor of said second plurality of transistors are stacked, said first plurality of transistors are not stacked.

8. A semiconductor integrated circuit according to claim 7, wherein:

said second plurality of transistors are n-transistors.

9. A semiconductor integrated circuit according to claim 7, wherein:

each transistor of said second plurality of transistors is effectively in series with another transistor.

10. A semiconductor integrated circuit according to claim 7, further comprising:

a third plurality of transistors, each transistor of said third plurality of transistors having a third channel length, said third channel length being smaller than said first channel length.

11. A semiconductor integrated circuit according to claim 10, wherein:

each transistor of said second plurality of transistors having a second channel length;

said second channel length being smaller than said first channel length and said third channel length.

12. A semiconductor integrated circuit according to claim 10, wherein:

at least one transistor of said third plurality of transistors is in series with at least one transistor of said second plurality of transistors.

13. A semiconductor integrated circuit according to claim 7, wherein:

said second plurality of transistors include one or more transistors in a multiplexer.

14. A semiconductor integrated circuit according to claim 7, wherein:

said second plurality of transistors include one or more transistors in a circuit comprising an inverter and a transfer gate.

15. A semiconductor integrated circuit according to claim 7, wherein:

said second plurality of transistors include one or more transistors in an AND-OR-Inverter circuit.

16. A semiconductor integrated circuit according to claim 7, wherein:

each transistor of said second plurality of transistors are in a low drain to source voltage environment as compared to said first plurality of transistors.

17. A semiconductor integrated circuit according to claim 7, wherein:

each transistor of said second plurality of transistors are in stacks, said stacks include a top transistor and one or more bottom transistors.

18. A semiconductor integrated circuit according to claim 17, wherein:

each top transistor is effectively in series with at least one bottom transistor.

19. A semiconductor integrated circuit according to claim 7, wherein:

each transistor of said second plurality of transistors are in stacks, said stacks include a top transistor and one or more bottom transistors; and said second plurality of transistors includes bottom transistors and does not include top transistors.

20. A semiconductor integrated circuit according to claim 7, wherein:

each transistor of said second plurality of transistors are in stacks, said stack include a top transistor and one or more bottom transistors; and said second plurality of transistors includes bottom transistors and top transistors.

21. A semiconductor integrated circuit, comprising:

a first plurality of transistors having a first channel length; and at least one NAND gate, said NAND gate comprising:
   a first p-transistor,
   a second p-transistor connected in parallel with said first p-transistor,
   a first n-transistor connected to said first p-transistor and said second p-transistor, and
   a second n-transistor connected in series with said first n-transistor, said second n-transistor having a second channel length, said second channel length being smaller than said first channel length, said first n-transistor and said second n-transistor are in a stack.

22. A semiconductor integrated circuit according to claim 21, wherein:

said first n-transistor has a channel length less than said first channel length.

23. A semiconductor integrated circuit according to claim 21, wherein:

said NAND gate does not experience a decrease in operating speed due to hot carrier injection when operating.

* * * * *